United States Patent
Sasaki et al.

(10) Patent No.: US 7,268,855 B2
(45) Date of Patent: Sep. 11, 2007

(54) PROJECTION OPTICAL SYSTEM

(75) Inventors: Takahiro Sasaki, Utsunomiya (JP);
Masayuki Susuki, Utsunomiya (JP)

(73) Assignee: Canon Kabushiki Kaisha, Ohta-ku, Tokyo (JP)

( * ) Notice: Subject to any disclaimer, the term of this patent is extended or adjusted under 35 U.S.C. 154(b) by 0 days.

(21) Appl. No.: 10/827,968

(22) Filed: Apr. 20, 2004

(65) Prior Publication Data

US 2004/0218163 A1    Nov. 4, 2004

(30) Foreign Application Priority Data

Apr. 23, 2003    (JP) .............. 2003-118479

(51) Int. Cl.
G03B 27/54    (2006.01)
G03B 27/42    (2006.01)
G03B 27/70    (2006.01)
G02B 5/08    (2006.01)

(52) U.S. Cl. .............. 355/67; 355/53; 355/66; 359/850; 359/857

(58) Field of Classification Search .............. 355/53, 355/67, 71, 47, 66, 55, 69; 359/838, 857, 359/850, 861
See application file for complete search history.

(56) References Cited

U.S. PATENT DOCUMENTS 5,686,728 A    11/1997    Shafer
6,172,825 B1 *    1/2001    Takahashi .............. 359/859
6,183,095 B1 *    2/2001    Hudyma .............. 359/857
6,353,470 B1 *    3/2002    Dinger .............. 355/71
2002/0114089 A1 *    8/2002    Dinger et al. .............. 359/853
2003/0099034 A1 *    5/2003    Mann et al. .............. 359/359
2003/0147131 A1 *    8/2003    Terasawa .............. 359/366
2004/0051857 A1 *    3/2004    Hudyma et al. .............. 355/67
2004/0125353 A1 *    7/2004    Takahashi .............. 355/67

FOREIGN PATENT DOCUMENTS

EP    0779528    6/1997
JP    2003-233001    * 8/2003
WO    WO 0248796    6/2002

OTHER PUBLICATIONS

European Search Report for Application EP 04252392, dated Apr. 27, 2006.
Official EPO Communication dated Feb. 9, 2007 in corresponding EOP Application No. 04 252 392.

* cited by examiner

Primary Examiner—Rodney Fuller
Assistant Examiner—Kevin Gutierrez
(74) Attorney, Agent, or Firm—Morgan & Finnegan, L.L.P.

(57) ABSTRACT

Disclosed is a projection optical system for projecting a pattern of a mask placed on an object plane, onto a substrate placed on an image plane. The projection optical system is arranged so that an intermediate image of the pattern formed on the mask, is formed between a third reflection surface and a fourth reflection surface. In accordance with a particular shape of the third reflection surface or with particular disposition, high-precision projection is ensured without enlargement in size of the whole system.

18 Claims, 5 Drawing Sheets

PROJECTION OPTICAL SYSTEM

FIELD OF THE INVENTION AND RELATED ART

This invention relates to a projection optical system and, more particularly, to a reflection type projection optical system suitably usable with ultraviolet light or extreme ultraviolet (EUV) light to perform projection exposure of a member to be processed, such as a monocrystal substrate for semiconductor wafer or a glass substrate for liquid crystal display (LCD), for example.

In order to meet reduction in size and thickness of electronic instruments, further miniaturization of semiconductor devices to be mounted in such electronic instruments has been required more and more. For example, as regards design rule for a mask pattern, it is required that an image of a size not greater than 0.1 µm in terms of line-and-space (L&S) can be formed in a wide range. Hereinafter, it will be changed over to formation of circuit patterns of not greater than 80 nm. The line-and-space (L&S) is an image that is projected during exposure upon a wafer in a state in which the line and the space have the same width, and it is a scale which designates the resolution of the exposure.

Projection exposure apparatuses which are representative exposure apparatuses for semiconductor production have a projection optical system for transferring, by projection exposure, a pattern formed on a mask or reticle (hereinafter, these terms will be used interchangeably) onto a wafer. The resolution R of a projection exposure apparatus (i.e. the minimum size that can be transferred exactly) can be given by use of a wavelength λ of a light source and a numerical aperture (NA) of a projection optical system, as follows:

$$R = k1 \times \lambda / NA \qquad (1)$$

It is seen from this that, by shortening the wavelength or by enlarging the NA, the resolution is improved (that is, resolvable linewidth becomes narrower). Recently, since the required resolution is very small, it can not be satisfied only by enlarging the NA, and shortening the wavelength is necessary to improve the resolution. In practice, exposure light sources have been changed from KrF excimer laser (wavelength is about 248 nm) and ArF excimer laser (wavelength is about 193 nm) to F2 laser (wavelength is about 157 nm), and also practical use of extreme ultraviolet (EUV) light is advancing.

However, as the shortening of the wavelength of light progresses, glass materials through which light can pass are limited. Hence, it becomes difficult to use many refractive elements (i.e. lenses) and, as compared therewith, use of reflective elements (i.e. mirrors) in the projection optical system becomes advantageous. Further, where EUV light is used as the exposure light, there is no usable glass material any more, and it becomes impossible to use a lens in the projection optical system. Thus, a reflection type projection optical system in which the projection optical is constituted only by mirrors (e.g. multilayered-film mirrors) has been proposed.

In such reflection type projection optical system, for enhanced reflectance, each mirror is formed with a multi-layered film so that reflected light can be mutually strengthened. However, in order to make the overall reflectance of the whole optical system higher, it is desirable to constitute the optical system by a least number of mirrors. Further, in order to avoid mechanical interference between a mask and a wafer, the number of mirrors constituting the projection optical system may desirably be even. Furthermore, although the NA has to be enlarged to meet required reduction in linewidth (resolution), being required for EUV exposure apparatuses (e.g. NA should be 0.2 with a wavelength 13.5 nm), it is difficult to reduce wavefront aberration with a conventional structure having three or four mirrors. In order to meet this and also to expand the degree of freedom for the wavefront aberration correction, it becomes necessary to use mirrors of a number of about six (hereinafter, such structure will be referred to also as a "six-mirror system"). An example of such six-mirror system is disclosed in U.S. Pat. No. 6,033,079.

U.S. Pat. No. 6,033,079 shows an embodiment of typical projection optical system comprising six reflection mirrors for EUV light. In this projection optical system, as incident light from an object plane is received, an intermediate image is formed by four reflection mirrors, from first reflection surface to fourth reflection surface, and then, by means of fifth reflection surface (of convex surface shape) and sixth reflection surface (of concave surface shape), the image is re-imaged upon an image plane. This structure is adopted for the following reason. That is, in order to attain a large NA, the light flux must be spread largely and incident on the six reflection surface and once it must be collected on the image plane. To this end, the diameter of the six reflection surface becomes large. In order to avoid eclipse of light at that surface and, on the other hand, to ensure that the light is incident on the fifth reflection surface from the fourth reflection surface, it is preferable that an intermediate image is produced after the fourth reflection surface. Moreover, for sufficient reduction of aberration, each reflection surface is formed with an aspherical shape.

Examples of reflection type projection optical system having six reflection surfaces are disclosed in Japanese Laid-Open Patent Application No. 09-211232 (U.S. Pat. No. 5,815,310) and Japanese Laid-Open Patent Application No. 2002-196242 (U.S. Pat. No. 6,556,648).

However, with the structure disclosed in aforementioned U.S. Pat. No. 6,033,079, the expansion of the light flux on the third reflection surface becomes relatively large and, for this reason, the effective diameter of the third reflection surface is made large. This makes the placement of the third reflection surface more difficult, for the third reflection surface is likely to be disposed in a place having no large clearance. Further, the light flux is spread largely on the fourth reflection surface and, for this reason, the effective diameter of the fourth surface is quite large as 700 mm. This makes the processing and measurement for the surface very difficult.

Moreover, in the aforementioned structure, since the intermediate image is produced just before the fifth reflection surface, an intense divergent light flux is incident on the fifth reflection surface. As a result of this, the incidence angle distribution on the fifth reflection surface becomes large. In the first embodiment disclosed in U.S. Pat. No. 6,033,079, where the image-side numerical aperture is 0.25 and the width of the image-side arcuate view field is 1 mm, the largest value of the incidence angle on the fifth reflection surface is 17.1 degrees while the smallest value is 0.4 degree, thus the incidence angle is distributed by 16.7 degrees. In that case, if the characteristics of a multilayered-film mirror are taken into account, because the incidence angle at the fifth mirror has a large distribution, notable degradation of the reflectance would be caused thereby, resulting in decreased throughput and deteriorated imaging characteristics.

Furthermore, since EUV light is absorbed by an air, the barrel must keep a vacuum. In the structure described above, the object-to-image distance becomes very large as 1500 mm, and the volume of the barrel where a vacuum has to be kept becomes too large. Practically, it causes a serious difficulty in maintaining a high vacuum.

SUMMARY OF THE INVENTION

The present invention concerns a projection optical system for projecting a pattern of a mask, placed on an object plane, onto a substrate placed on an image plane. Specifically, a projection optical system according to an aspect of the present invention is arranged so that an intermediate image is formed between a third reflection surface and a fourth reflection surface, in an order from the object side. Also, in accordance with a particular shape of the third reflection surface and/or with particular disposition, the projection optical system ensures high-precision projection without enlargement of the whole system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is a flow chart for explaining the procedure of manufacturing microdevices such as semiconductor chips (IC or LSI), LCD, CCD, or the like.

DESCRIPTION OF THE PREFERRED EMBODIMENTS

Preferred embodiments of the present invention will now be described with reference to the attached drawings. Specifically, a few examples of reflection type reduction projection optical system will be explained below, as one aspect of the present invention. It should be noted however that the present invention is not limited to these embodiments. For example, various components may be replaced alternatively within the limits in which the object of the present invention is attainable.

Figure 1:
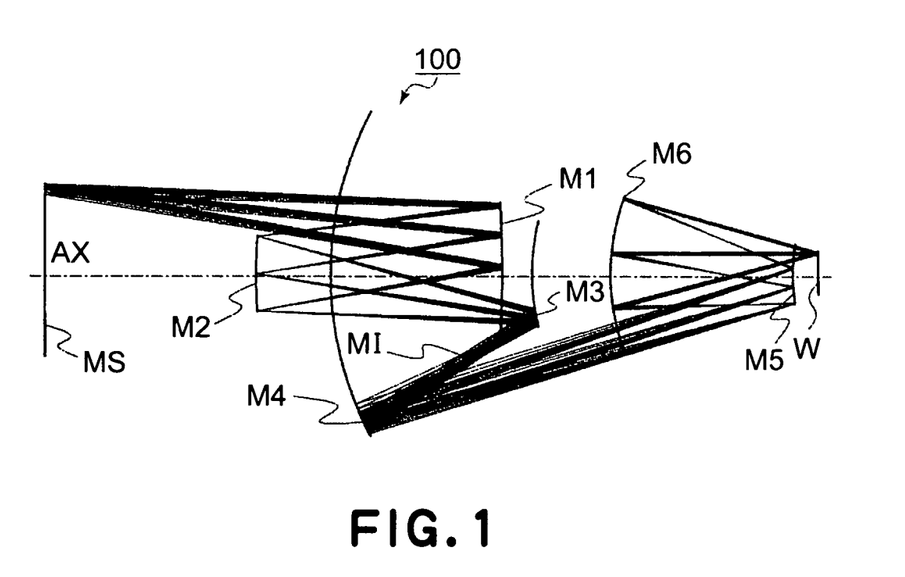
FIG. 1 is a schematic view, illustrating a light path in a projection optical system according to a first embodiment of the present invention.
Figure 2:
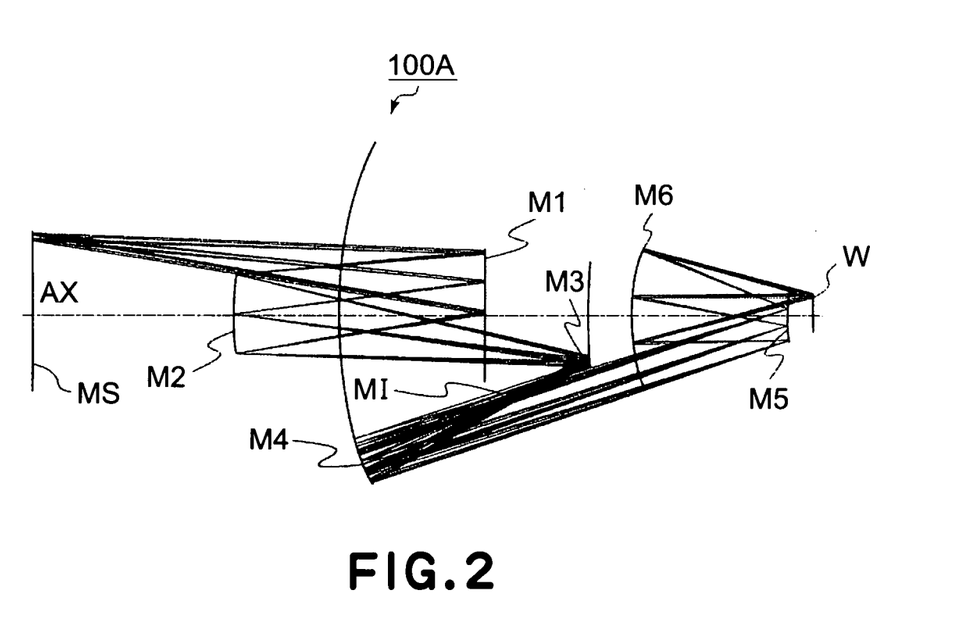
FIG. 2 is a schematic view, illustrating a light path in a projection optical system according to a second embodiment of the present invention.
Figure 3:
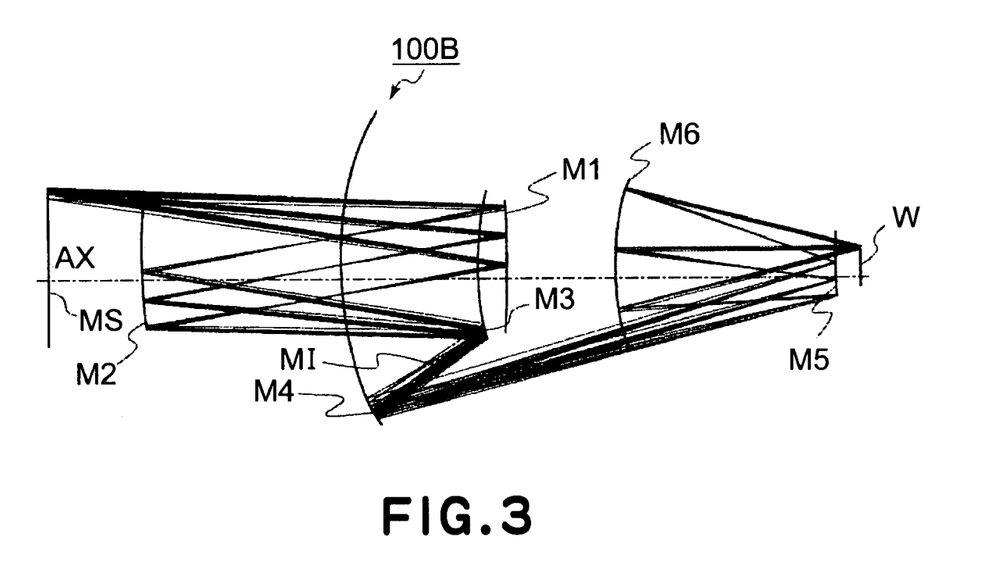
FIG. 3 is a schematic view, illustrating a light path in a projection optical system according to a third embodiment of the present invention.

FIGS. 1-3 each illustrates a reflection type reduction projection optical system and a light path thereof, according to one of first, second and third embodiments of the present invention, to be described later in more detail. The reduction projection optical systems of these embodiments are an optical system that functions to project, in a reduced scale, a pattern formed on an object surface MS (e.g. mask surface) onto an image plane W (e.g. the surface of a member such as a substrate to be processed), and particularly it is suitably usable with EUV light (wavelength is 10-15 nm, more preferably, 13.4-13.5 nm).

The reflection reduction projection optical system has six reflection mirrors which comprises, basically along a light path from the object plane MS side to the image plane W and in an order of reflection of light, a first reflection mirror M1 (concave mirror), a second reflection mirror M2 (concave mirror), a third reflection mirror M3 (convex mirror), a fourth reflection mirror M4 (concave mirror), a fifth reflection mirror M5 (convex mirror), and a sixth reflection mirror M6 (concave mirror). Light from the object plane MS forms an intermediate image MI of the pattern, in a portion of the light path from the third reflection mirror M3 to the fourth reflection mirror M4. Additionally, by means of the fifth reflection mirror M5 and the sixth reflection mirror M6, the pattern is re-imaged upon the image plane W.

The light rays incident on the first reflection mirror M1 from the object plane MS are non-telecentric, while the emitted light rays at the image side are telecentric. In order that a reflection type reticle placed on the object plane MS is illuminated by means of an illumination optical system provided separately, it is essential that the object side is made non-telecentric so that a certain incidence angle is defined. As regards the image plane side, on the other hand, it should desirably be made telecentric so that, even if a wafer W placed on the image plane moves in the optical axis direction, a change of magnification is kept small.

A reflection type reduction projection optical system according to any one of these embodiments basically comprises a co-axial optical system which is axially symmetrical about a single optical axis, such that, as an advantageous feature, it is sufficient to correct the aberration only within a narrow ring-like region about the optical axis. However, for aberration correction or aberration adjustment, it is not always necessary that the six mirrors are disposed to provide a completely co-axial system. A slight eccentricity may be included to increase the degree of freedom in respect to aberration or disposition. Thus, in this specification, the reference to "substantially co-axial optical system" includes a complete co-axial structure and also a structure in which a mirror or mirrors are tilted or placed with small eccentricity for aberration adjustment.

In order that the NA is made large and that an image is formed while keeping the back focus, it is preferable that the fifth mirror M5 is provided by a convex mirror while the sixth mirror M6 is provided by a concave mirror.

Further, since no reflection mirror is registered with the position where the aforementioned intermediate image is produced, in this structure there is small possibility that a dust particle is transferred or aberration is produced due to energy concentration. Moreover, all the reflection surfaces can be disposed within a space between the object plane MS to the image plane W. Thus, there is an advantageous feature that disposition of a reticle stage or a wafer stage is facilitated significantly.

Where the mirrors have curvature radii $r_1$-$r_6$, it is necessary that the sum of Petzval terms becomes equal to or nearly equal to zero, as set forth in equation (2) or (3) below.

$$1/r_1 - 1/r_2 + 1/r_3 - 1/r_4 + 1/r_5 - 1/r_6 = 0 \quad (2)$$

$$1/r_1 - 1/r_2 + 1/r_3 - 1/r_4 + 1/r_5 - 1/r_6 \approx 0 \quad (3)$$

In a reflection type projection optical system according to any one of these embodiments, an intermediate image is formed between the third mirror M3 and the fourth mirror M4, and the projection optical system is constituted by a combination of an imaging system comprising three mirrors in the first half and an imaging system comprising three mirrors in the latter half. In the imaging system of the first half, the third mirror M3 has a convex shape, whereas in the imaging system of the latter half, the fifth mirror has a convex shape. With this structure, in the respective imaging systems, the sum of Petzval terms is diminished and thus good imaging characteristics are accomplished. Also, even if the third mirror M3 is not a convex mirror, similar advantageous results are obtainable provided that the angle defined between the optical axis and a principal ray being incident on the fourth mirror from the third mirror is not less than 12 degrees, more preferably, not less than 19 degrees, in a direction away from the optical axis. Further, the above-described angle defined by the principal ray should preferably be not greater than 70 degrees. This is because of the following reasons. If the angle defined between the optical axis and a normal to the mirror surface at an end of the effective diameter thereof is not less than 45 degrees, the processing becomes very difficult to accomplish. Additionally, if the incidence angle of light rays with respect to the normal to the surface is not less than 25 degrees, due to the multilayered films, adverse influences on the imaging characteristics are likely to occur.

In the case described above, there is an additional feature that eclipse of light, incident on the fifth mirror M5 from the fourth mirror M4, at the third mirror M3 or sixth mirror M6 can be prevented effectively.

A reflection type reduction projection optical system according to any one of these embodiments comprises six mirrors, and at least one of them may have an aspherical surface. The shape can be expressed by a usual equation (4) below. However, from the standpoint of aberration correction, the number of aspherical surfaces should be large as much as possible. All the six mirrors may preferably have an aspherical surface.

$$Z = \left[ ch^2 / \left\{ 1 + \sqrt{1 - (1+k)c^2h^2} \right\} \right] + Ah^4 + Bh^6 + Ch^8 + Dh^{10} + Eh^{12} + Fh^{14} + Gh^{16} + Hh^{18} + Jh^{20} + \ldots \quad (4)$$

In equation (4), Z is the coordinate in the optical axis direction, c is the curvature (inverse of curvature radius r), h is the height from the optical axis, k is a conic constant, A, B, C, D, E, F, G, H, J, . . . are aspherical coefficients of fourth order, sixth order, eighth order, tenth order, twelfth order, fourteenth order, sixteenth order, eighteenth order, twentieth order, and etc.

By the way, as regards the processing and measurement for an aspherical surface, it becomes difficult to achieve where the aspherical amount is large or the effective diameter of the mirror is large. In the optical system shown in FIG. 1, 2 or 3, as described hereinbefore, an intermediate image is formed in a portion of the light path between the third mirror M3 and the fourth mirror M4. Additionally, the third mirror M3 is spatially disposed closer to the object plane M5 side, than to the sixth mirror M6. With this arrangement, the effective diameter of the third mirror M3 can be made relatively small and, additionally, the expansion of light flux on the third mirror M3 can be made small. As a result, the aspherical amount can be held small, such that the measurement and processing of the aspherical surface shape is made easier.

Further, because the expansion of the light flux on the third mirror M3 is made small, disposition of the third mirror M3 (which is likely to be placed in a space where many light fluxes are present) is facilitated. In other words, the third mirror M3 can be disposed while a space for accommodating a mirror holding mechanism or a driving mechanism is retained about the third mirror M3. Also, there will be an additional advantage that eclipse of light incident on the fifth mirror M5 from the fourth mirror M4, by the third mirror M3 or sixth mirror M6, is avoided effectively.

The processing and measurement of a reflection surface having a convex shape is more difficult than for a reflection surface having a concave shape. In the optical system shown in FIG. 1, 2 or 3, the third mirror M3 and the fifth mirror M5 are reflection surfaces having a convex shape. The effective diameter of the fifth mirror M5 is relatively small, but the effective diameter of the third mirror M3 is likely to be large such that the processing and measurement of it becomes difficult. In consideration of this, in this embodiment, an intermediate image is produced between the third mirror M3 and the fourth mirror M4, by which the expansion of light flux on the third mirror M3 is made smaller and by which the aspherical amount and the effective diameter are made smaller. Thus, the processing and measurement is made easier. As an example, the third mirror M3 of convex shape may be formed with an aspherical amount of 0.01 μm to 8 μm, more preferably, 0.01 μm to 5 μm, and the processing and measurement is easy in that occasion.

By the way, in an embodiment disclosed in aforementioned U.S. Pat. No. 6,033,079, an intermediate image is formed between a fourth mirror M4 and a fifth mirror M5. By changing the intermediate image forming position to between the third mirror M3 and the fourth mirror M4, the effective diameter of the third mirror M3 becomes small and the degree of freedom of disposition is enlarged. Additionally, the aspherical amount of the third mirror M3 is reduced. Thus, in the thus arranged system, the processing and measurement is easy.

Each mirror is provided with a multilayered film for reflecting EUV light, and a light intensifying function based on it is utilized. A multilayered film effective to reflect EUV light of a wavelength not longer than 20 nm may be, for example, Mo/Si multilayered film in which molybdenum (Mo) and silicon (Si) are alternately laminated, and Mo/Be multilayered film in which molybdenum (Mo) and beryllium (Be) are alternately laminated. Optimum materials may be chosen in accordance with a used wavelength. It should be noted here that the materials of the multilayered film are not limited to the examples described above. Any materials having similar effect may be used.

By the way, in conventional EUV projection optical systems having six mirrors, since an intermediate image is formed just before the fifth mirror M5, the incidence angle distribution upon the fifth mirror M5 is too large. As a result, degradation of the imaging characteristics due to the multilayered film is a problem to be considered. In the optical system according to this embodiment, as compared therewith, a fourth mirror is disposed in a portion of the light path from the intermediate image to the fifth mirror. This arrangement enables adjustment of the light ray incidence angle on the fifth mirror M5, through the fourth mirror M4. As a result, degradation of the imaging characteristics such as described above can be reduced significantly. Thus, in this embodiment, a largest value and a smallest value of the incidence angle of light, being incident on the fifth mirror M5, are set with a mutual difference of not less than 8 degrees and not greater than 15 degrees. With this structure, advantageous effects such as described above are provided. More preferably, the lower limit value may be 10 degrees and the upper limit value may be 14 degrees.

Next, each of the reflection type projection optical systems according to first to third embodiments shown in FIGS. 1-3, respectively, will be described in greater detail.

First Embodiment

Referring to FIG. 1 and Table 1 below, a reflection type projection optical system 100 according to a first embodiment will be explained.

The reflection type projection optical system 100 of the first embodiment comprises six reflection mirrors. More specifically, in an order of reflection of light from the object plane M5 side, basically it comprises a first reflection mirror M1 (concave mirror), a second reflection mirror M2 (concave mirror), a third reflection mirror M3 (convex mirror), a fourth reflection mirror M4 (concave mirror), a fifth reflection mirror M5 (convex mirror), and a sixth reflection mirror M6 (concave mirror). An intermediate image MI is formed in a portion of the light path from the third mirror M3 to the fourth mirror M4. By means of the remaining mirrors, the intermediate image MI is re-imaged upon the image plane W.

Denoted at M5 is a reflection type mask which is placed at the object plane position, and denoted at W is a wafer which is placed at the image plane position. The reflection type mask as illuminated by an unshown illumination optical system is projected, in a reduced scale, on a wafer (image plane) by means of the reflection type reduction projection optical system.

Table 1 describes details of the optical system 100 of FIG. 1. The image-side numerical aperture NA is 0.26, the magnification is 1:4, and the object height is 138-146 mm (arcuate-shaped view field having a width 2 mm at the image side). The wavefront aberration RM5 is 15 m$\lambda$, and the distortion is in a range 3 nm.

In this example, the third mirror M3 has a convex shape, and the angle defined, with respect to the optical axis, by a principal ray incident on the fourth mirror M4 from the third mirror M3 is 32.7 degrees in a direction away from the optical axis. With this structure, the sum of Petzval terms in the imaging system of the first half (comprising first mirror M1, second mirror M2 and third mirror M3) is adjusted and, additionally, eclipse of light, incident on the fifth mirror M5 from the fourth mirror M4, by the third mirror or sixth mirror M6 is avoided effectively.

As regards the aspherical amount of the third mirror M3, it can be made relatively small as of 1.31 µm where the image side numerical aperture is 0.25 and the width of the image side arcuate view field is 1 mm. Thus, the system has an advantage of easy processing and measurement.

Further, when the intermediate image is formed between the third mirror M3 and the fourth mirror M4, the overall length is likely to become small and, in fact, in the optical system 100 of FIG. 1, the overall length is relatively small such as 1236 mm.

As regards the incidence angle at the fifth mirror M5, where the image side numerical aperture is 0.25 and the image side arcuate view field has a width 1 mm, the smallest value is 7.7 degrees and the largest value is 21 degrees. The range is 13.3 degrees. Since the incidence angle range is made relatively small, degradation of imaging characteristics due to multilayered films is well suppressed.

TABLE 1

| Mirror No. | Curvature Radius | Surface Spacing |
|---|---|---|
| M (mask) | ∞ | 339.4777 |
| M1 | −2000 | −391.3436 |
| M2 | 872.6187 | 439.2202 |
| M3 | 375.1731 | −320.8985 |
| M4 | 580.6132 | 737.9442 |
| M5 | 305.1026 | −292.1313 |
| M6 | 375.1247 | 322.1313 |
| W (wafer) | ∞ |  |

Aspherical Coefficients:

M1 K: −116.931826
   A: −.670181E−10   B: 0.144096E−13   C: −.435492E−18
   D: 0.145193E−22   E: −.622756E−27   F: 0.231827E−31
   G: −.421307E−36

M2 K: 2.007473
   A: −.373122E−09   B: −.136205E−15   C: 0.157375E−18
   D: −.744742E−22   E: 0.236381E−25   F: −.408634E−29
   G: 0.292633E−33

M3 K: 3.471994
   A: −.901676E−08   B: 0.289184E−12   C: −.657974E−16
   D: 0.287681E−20   E: 0.255935E−24   F: −.390393E−28
   G: 0.137163E−32

M4 K: −0.044686
   A: 0.956942E−10   B: 0.736613E−17   C: −.101759E−19
   D: 0.207511E−24   E: −.658861E−30   F: −.108501E−34
   G: 0.738458E−40

M5 K: 2.120289
   A: −.610258E−08   B: 0.542562E−12   C: 0.338684E−16
   D: −.158906E−19   E: 0.800719E−23   F: −.217410E−26
   G: 0.251994E−30

M6 K: 0.041759
   A: 0.106631E−09   B: 0.104596E−14   C: 0.986450E−20
   D: −.873016E−25   E: 0.929688E−29   F: −.246930E−33
   G: 0.265927E−38

Second Embodiment

Referring to FIG. 2 and Table 2 below, a reflection type projection optical system 100A according to a second embodiment will be explained.

Table 2 describes details of the optical system 100A of FIG. 2. The image-side numerical aperture NA is 0.26, the magnification is 1:4, and the object height is 140-144 mm (arcuate-shaped view field having a width 2 mm at the image side). The wavefront aberration RM5 is 13.5 m$\lambda$, and the distortion is in a range 1.4 nm.

In this example, the third mirror M3 has a convex shape, and the angle defined, with respect to the optical axis, by a principal ray incident on the fourth mirror M4 from the third mirror M3 is 26.3 degrees in a direction away from the optical axis. With this structure, the sum of Petzval terms in the imaging system of the first half (comprising first mirror M1, second mirror M2 and third mirror M3) is adjusted and, additionally, eclipse of light, incident on the fifth mirror M5 from the fourth mirror M4, by the third mirror or sixth mirror M6 is avoided effectively.

As regards the aspherical amount of the third mirror M3, it can be made relatively small as of 1.94 µm where the image side numerical aperture is 0.25 and the width of the image side arcuate view field is 1 mm. Thus, the system has an advantage of easy processing and measurement.

Further, when the intermediate image is formed between the third mirror M3 and the fourth mirror M4, the overall length is likely to become small and, in fact, in the optical system 100A of FIG. 2, the overall length is relatively small such as 1343 mm.

As regards the incidence angle at the fifth mirror M5, where the image side numerical aperture is 0.25 and the image side arcuate view field has a width 1 mm, the smallest value is 9.3 degrees and the largest value is 21 degrees. The range is 11.7 degrees. Since the incidence angle range is made relatively small, degradation of imaging characteristics due to multilayered films is well suppressed.

TABLE 2

| Mirror No. | Curvature Radius | Surface Spacing |
|---|---|---|
| M (mask) | ∞ θ | 782.9024 |
| M1 | −3000 | −434.2191 |
| M2 | 986.3720 | 605.0807 |
| M3 | 557.8812 | −433.0176 |
| M4 | 718.6422 | 783.6680 |
| M5 | 274.00041 | −270.6504 |
| M6 | 356.0210 | 313.7101 |
| W (wafer) | ∞ θ | θ |

Aspherical Coefficients:

M1 K: −177.180694
 A: 0.793933E−09  B: −.393306E−14  C: −.139116E−19
 D: 0.130527E−23  E: −.311665E−28  F: 0.443632E−34
 G: 0.267089E−37
M2 K: 0.449622
 A: 0.229919E−10  B: 0.156132E−14  C: −.182568E−18
 D: 0.963975E−22  E: −.256166E−25  F: 0.351754E−29
 G: −.194839E−33
M3 K: −0.045120
 A: 0.659822E−09  B: −.557183E−13  C: 0.410361E−16
 D: −.317182E−20  E: −.237235E−24  F: 0.425191E−28
 G: .160620E−32
M4 K: 0.002787
 A: 0.708916E−10  B: −.639861E−15  C: 0.839509E−20
 D: −.241587E−25  E: −.369797E−30  F: 0.384196E−35
 G: −.109928E−40
M5 K: 0.315310
 A: 0.138224E−08  B: 0.105862E−11  C: 0.197184E−16
 D: 0.895863E−20  E: −.304525E−23  F: 0.775932E−27
 G: −.877582E−31
M6 K: 0.039889
 A: 0.147010E−09  B: 0.153805E−14  C: 0.543962E−20
 D: 0.129313E−23  E: −.101970E−27  F: 0.464801E−32
 G: −.850841E−37

Third Embodiment

Referring to FIG. 3 and Table 3 below, a reflection type projection optical system 100B according to a third embodiment will be explained.

The image-side numerical aperture NA of the projection optical system 100B shown in FIG. 3 is 0.25, the magnification is 1:4, and the object height is 122-130 mm (arcuate-shaped view field having a width 2 mm at the image side). The wavefront aberration RMS is 13.5 mλ, and the distortion is in a range 2.3 nm.

In this example, the third mirror M3 has a convex shape, and the angle defined, with respect to the optical axis, by a principal ray incident on the fourth mirror M4 from the third mirror M3 is 36 degrees in a direction away from the optical axis. With this structure, the Petzval sum in the imaging system of the first half (comprising first mirror M1, second mirror M2 and third mirror M3) is adjusted and, additionally, eclipse of light, incident on the fifth mirror M5 from the fourth mirror M4, by the third mirror M3 or sixth mirror M6 is avoided effectively. Also, there is an aperture stop defined in a portion of the light path between the first mirror M1 and the second mirror M2.

As regards the aspherical amount of the third mirror M3, it can be made relatively small as of 0.44 µm where the image side numerical aperture is 0.25 and the width of the image side arcuate view field is 1 mm. Thus, the system has an advantage of easy processing and measurement.

Further, when the intermediate image is formed between the third mirror M3 and the fourth mirror M4, the overall length is likely to become small and, in fact, in the optical system 100B of FIG. 3, the overall length is relatively small such as 1361 mm.

As regards the incidence angle at the fifth mirror M5, where the image side numerical aperture is 0.25 and the image side arcuate view field has a width 1 mm, the smallest value is 5.65 degrees and the largest value is 19.1 degrees.

The range is 13.4 degrees. Since the incidence angle range is made relatively small, degradation of imaging characteristics due to multilayered films is well suppressed.

TABLE 3

| Mirror No. | Curvature Radius | Surface Spacing |
|---|---|---|
| M (mask) | ∞ θ | 768.3742 |
| M1 | −1396.8231 | −314.9793 |
| Stop | ∞ θ | −291.8614 |
| M2 | 1368.8180 | 557.6862 |
| M3 | 441.4054 | −229.5154 |
| M4 | 582.6684 | 828.6221 |
| M5 | 322.1290 | −366.0451 |
| M6 | 452.2826 | 408.6979 |
| W (wafer) | ∞ θ | θ |

Aspherical Coefficients:

M1 K: 0.260716
 A: 0.146445E−08  B: −.164758E−13  C: 0.317627E−18
 D: −.207116E−22  E: 0.179601E−26  F: −.908835E−31
 G: 0.191325E−35  H: 0.000000E+00
M2 K: −14.574333
 A: 0.741726E−09  B: −.275694E−14  C: 0.992898E−19
 D: −.174216E−22  E: 0.200285E−26  F: −.121819E−30
 G: 0.304220E−35  H: 0.000000E+00
M3 K: 0.276803
 A: −.131078E−08  B: 0.659659E−13  C: −.277262E−17
 D: 0.256152E−22  E: −.171689E−28  F: 0.100339E−30
 G: −.342734E−35  H: 0.000000E+00
M4 K: −0.008783
 A: 0.106495E−08  B: −.233547E−13  C: 0.308297E−18
 D: −.194328E−23  E: 0.153263E−29  F: 0.431370E−34
 G: −.146560E−39  H: 0.000000E+00
M5 K: −0.233173
 A: 0.184221E−08  B: 0.780441E−12  C: −.272684E−16
 D: 0.210085E−19  E: −.103583E−22  F: 0.269109E−26
 G: −.282927E−30  H: 0.000000E+00
M6 K: −0.026937
 A: 0.129873E−09  B: 0.749528E−15  C: 0.434370E−20
 D: −.363118E−25  E: 0.260695E−29  F: −.471061E−34
 G: 0.992951E−40  H: 0.000000E+00

Embodiment of Exposure Apparatus

Figure 4:
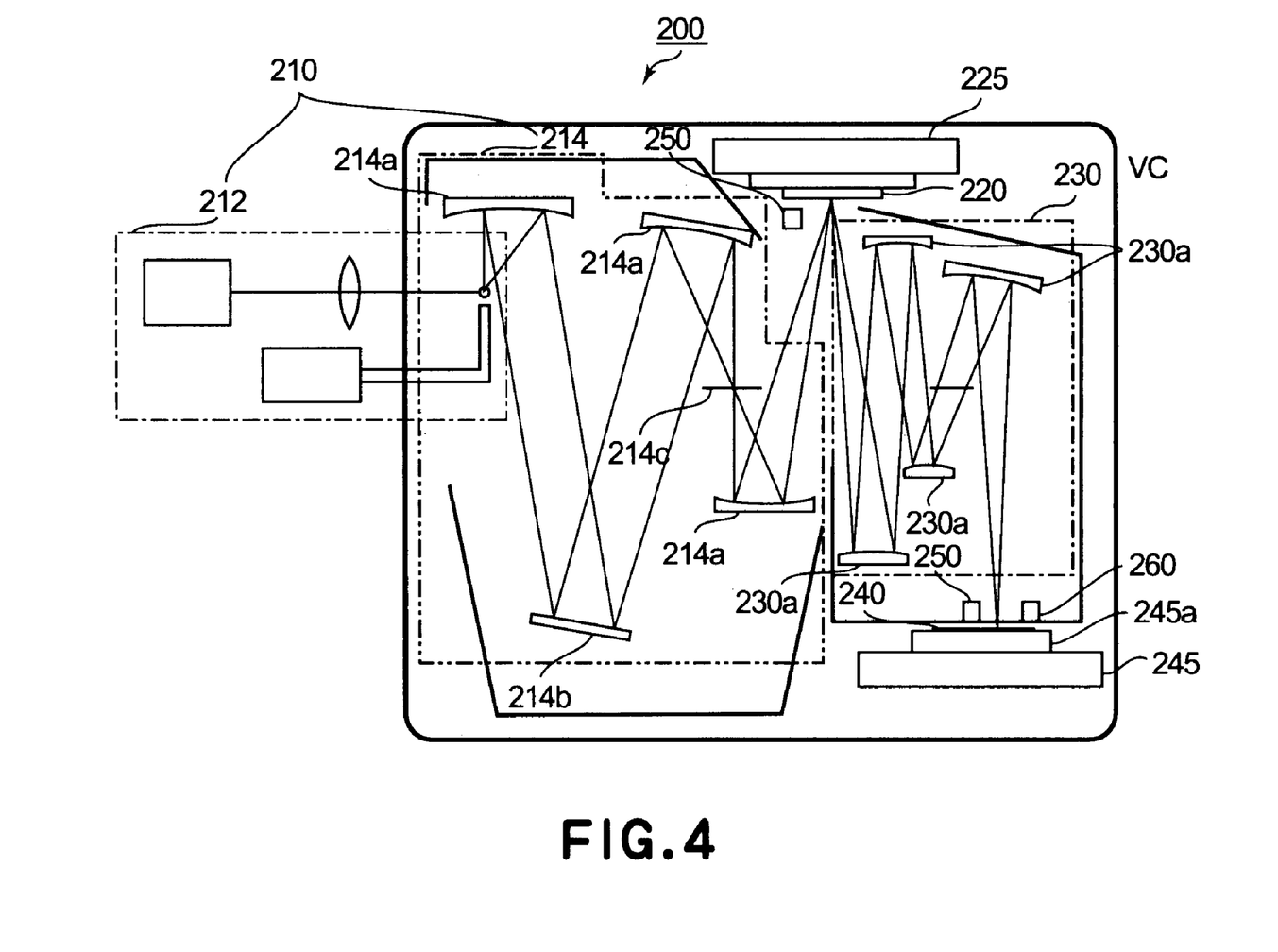
FIG. 4 is a schematic view of a general structure of an exposure apparatus, according to an embodiment of the present invention.

Next, referring to FIG. 4, an example of exposure apparatus 200 into which any one of the projection optical systems 100, 100A and 100B having been described with reference to the first to third embodiments is incorporated, will be explained. FIG. 4 is a schematic view of a general structure of an example of exposure apparatus 200 according to an aspect of the present invention.

The exposure apparatus 200 is a projection exposure apparatus arranged to photolithographically transfer, by use of EUV light (e.g. wavelength 13.4 nm) as illumination light for exposure, a circuit pattern formed on a mask 220 onto a workpiece 240 to be processed, in accordance with a step-and-scan method or step-and-repeat method. Such exposure apparatus is particularly suitably usable in a lithographic process for submicron or quarter micron order or less. Hereinafter, this embodiment will be described with reference to a step-and-scan type exposure apparatus (which may be called a "scanner"). Here, the "step-and-scan method" refers to an exposure method in which a wafer is continuously scanned (scanningly moved) relative to a mask so that a mask pattern is transferred to the wafer and, additionally, after exposure of one shot is completed, the wafer is moved stepwise so that a subsequent exposure region is placed. On the other hand, the "step-and-repeat method" is an exposure method in which, for each zone exposure of a wafer, the wafer is moved stepwise so that an exposure region for the subsequent shot is placed.

Referring to FIG. 4, the exposure apparatus 200 comprises an illumination device 210 for illuminating a mask 220 with light from a light source, a mask stage 225 for carrying the mask 220 thereon, a projection optical system 230 for directing light from the mask 220 to a workpiece 240 to be processed, a wafer stage 245 for carrying the workpiece 240 thereon, an alignment detecting mechanism 250, and a focus position detecting mechanism 260. Here, in FIG. 4, the number of reflection surfaces (mirrors) of the reflection type projection optical system, being present from reflection at the mask to impingement on the workpiece (wafer), is four. However, this is merely for simplicity of illustration. Actually, the number of reflection surfaces of this reflection type projection optical system may preferably be six, as has been described with reference to the first, second and third embodiments. As a matter of course, without deviating from the essence of the present invention, the number of the reflection surfaces can be changed, and it is still within the scope of the present invention.

The transmissivity of EUV light to atmospheric air is low, and contamination is easily produced due to reaction with any residual gas component such as high polymer organic gas. In consideration of this, as shown in FIG. 4, at least the light path along which the EUV light advances (that is, the optical system as a whole) is held in a vacuum ambience VC.

The illumination device 210 is illuminates the mask 220 with EUV light (e.g. wavelength 13.4 nm) having an arcuate shape corresponding to the arcuate view field of the projection optical system 230. It comprises a EUV light source 212 and an illumination optical system 214.

The EUV light source 212 comprises a laser plasma light source, for example. In such laser plasma light source, pulse laser light having a strong intensity is projected against a target material inside a vacuum container, thereby to produce a high-temperature plasma. Then, EUV light having a wavelength of about 13 nm, for example, emitted from the plasma is used. As regards the target material, metal film, gas jet, or liquid drops, for example, may be used. For increased average intensity of the emitted EUV light, the repetition frequency of the pulse laser should be higher and, usually, the laser is operated at a repetition frequency of a few kHz.

The illumination optical system 214 comprises condensing mirrors 214a, an optical integrator 214b, and so on. The condensing mirror 214a serves collect EUV light emitted approximately isotropically from the laser plasma. The optical integrator 214b functions to illuminate the mask 220 uniformly with a predetermined numerical aperture. Also, the illumination optical system 214 has a aperture 214c defined at a position being optically conjugate with the mask 220, for restricting the illumination region on the mask 220 into an arcuate shape. The illumination optical system 240 may be provided with a cooling device for cooling the condensing mirrors 214a and optical integrator 214b, which are optical elements constituting the illumination optical system 214. By cooling the condensing mirror 214 and optical integrator 214b, deformation of these components due to thermal expansion can be prevented effectively, such that superior imaging performance can be maintained.

The mask 220 is a reflection type mask, and it has formed thereon a circuit pattern (or image) to be transferred to a workpiece. The mask 220 is supported and moved by the mask stage 225. Diffraction-light produced from the mask 220 is reflected by the projection optical system 230 such as described with reference to the first to third embodiments, and thus it is projected on the workpiece 240. The mask 220 and the workpiece 240 are placed in an optically conjugate relation with each other. Since the exposure apparatus 200 is a step-and-scan type exposure apparatus, through the scan of the mask 220 and the workpiece 240, the pattern of the mask 220 is projected in a reduced scale onto the workpiece 240.

The mask stage 225 carries the mask 220 thereon, and it is connected to an unshown moving mechanism. As regards the mask stage 225, any structure well known in the art may be applied. The unshown moving mechanism may comprise a linear motor or the like, and it functions to move the mask stage 225 in at least X direction thereby to move the mask 220. The exposure apparatus operates to scan the mask 220 and the workpiece 240 in synchronism with each other.

The projection optical system 230 functions, by use of a plurality of reflection mirrors (i.e. multilayered-film mirrors) 230a, to project a pattern formed on the mask 220 surface onto the workpiece (image plane) in a reduced scale. The number of the mirrors 230a may be about four to six (preferably, it is six, but it may be four or eight, for example). In order to accomplish a wide exposure region with a small number of mirrors, only a narrow arcuate ring-like region (ring field) spaced from the optical axis by a predetermined distance is used, and the mask 220 and the workpiece 240 are scanned simultaneously to transfer a wide area. The numerical aperture NA of the projection optical system 230 is about 0.2 to 0.3. The mirrors 230a which are optical components constituting such projection optical system 230 may be cooled by use of a cooling device. By cooling the mirrors 230a, deformation thereof due to thermal expansion can be prevented effectively, and superior imaging performance can be maintained.

The workpiece 240 is a wafer, in this embodiment. However, it may be various members to be processed, such as a liquid crystal substrate, for example. The workpiece 240 is coated with a photoresist.

The wafer stage 245 has a wafer chuck 245a that supports the workpiece 240. The wafer stage 245 functions to move the workpiece 240 in X, Y and Z directions, by use of a linear motor, for example. The mask 220 and the workpiece 240 are scanned in synchronism with each other. Also, the position of the mask stage 225 and the position of the wafer stage 245 are monitored by use of laser interferometers, for example, and these stages are driven at a certain speed ratio.

The alignment detecting mechanism 250 serves to measure the positional relationship between the mask 220 position and the optical axis of the projection optical system 230 as well as the positional relationship between the workpiece 240 position and the optical axis of the projection optical system 230. Also, it functions to set the positions and angles of the mask stage 225 and the wafer stage 245 so that a projected image of the mask 220 is registered with a predetermined position upon the workpiece 240.

The focus position detecting mechanism 260 operates to measure the focus position of the workpiece 240 surface, such that, by controlling the position and angle of the wafer stage 245, during the exposure the workpiece 240 surface can be continuously held at the imaging position defined by the projection optical system 230.

In exposure operation, EUV light projected from the illumination device 210 illuminates the mask 220, and the pattern formed on the mask 220 surface is imaged on the workpiece 240 surface. In this embodiment, the image plane is an arcuate-shaped (ring-like) image plane and, by scanning (scanningly moving) the mask 220 and the workpiece 240 at a speed ratio corresponding to the reduction magnification, the whole surface of the mask is exposed.

In exposure apparatuses, since the optical performance is sensitive to changes in shape of optical components of a projection optical system, a cooling device may be used in relation to the optical components (reflection surfaces) of the projection optical system, particularly, for those optical components at the mask side where the light quantity is larger. However, a cooling device may be used for an illumination optical system. Particularly, as regards a reflection optical member which is closest to a light source, among many optical components, a largest amount of light impinges on such optical member and, consequently, it absorbs a large heat amount. Thus, the amount of change in the shape of such optical component due to the absorbed heat is very large. In order to avoid this, a cooling device may be used such as described above, to prevent a temperature rise due to absorption of large amount of light. In that occasion, any temperature difference in optical component can be reduced and thus a change in the shape thereof can be suppressed effectively.

Embodiment of Device Manufacturing Method

Next, referring to FIGS. 5 and 6, an embodiment of a device manufacturing method which uses an exposure apparatus described above, will be explained.

Figure 5:
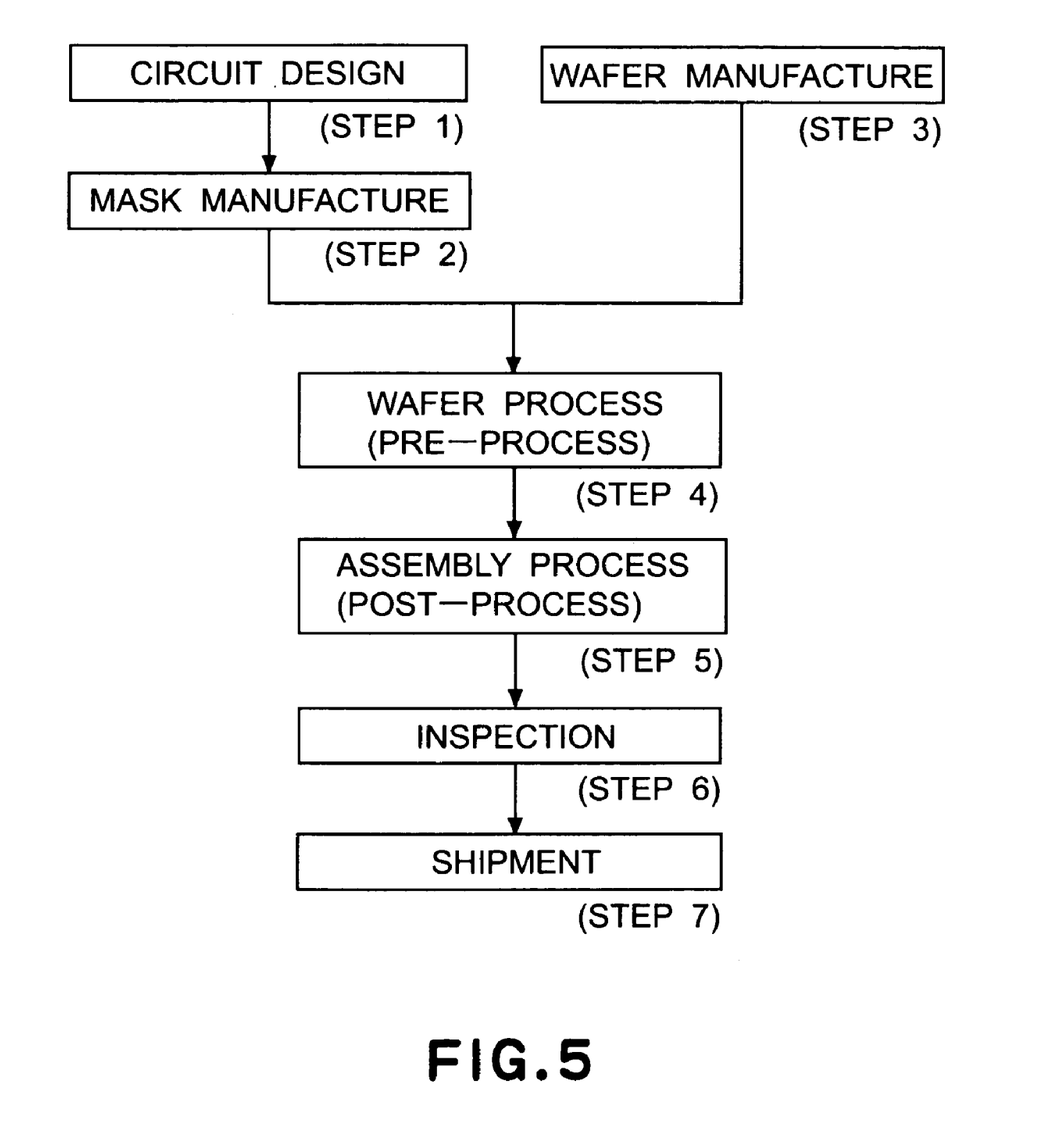

FIG. 5 is a flow chart for explaining the procedure of manufacturing various microdevices such as semiconductor chips (e.g., ICs or LSIs), liquid crystal panels, or CCDs, for example. This embodiment will hereinafter be described with reference to production of semiconductor chips. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 6:
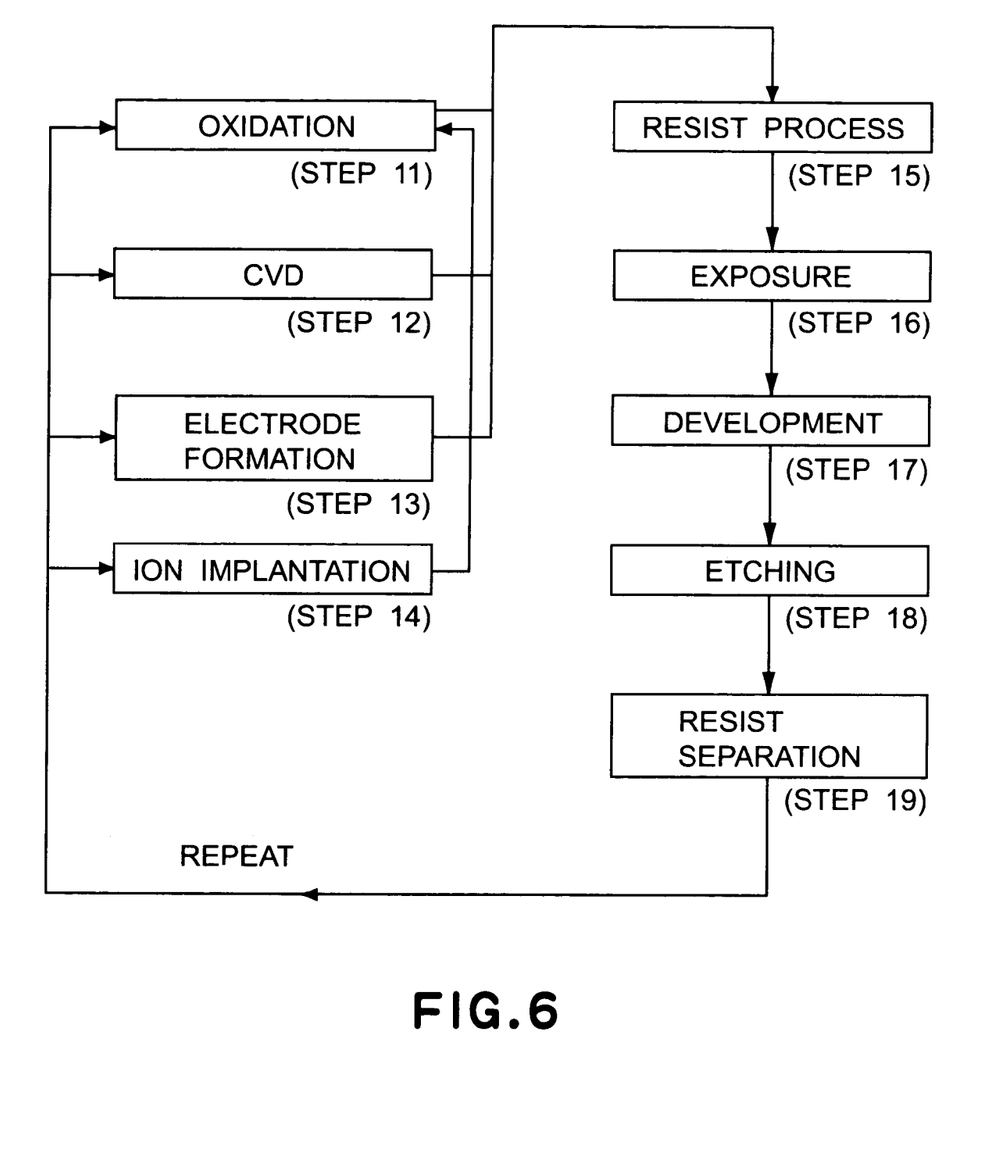
FIG. 6 is a flow chart for explaining details of a wafer process at step 4 of FIG. 5.

FIG. 6 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, higher-quality microdevices can be manufactured. Thus, a device manufacturing method that uses an exposure apparatus 200 as well as a device itself as a product thereof, are both included in the scope of the present invention.

While some preferred embodiments of the present invention have been described hereinbefore, the invention is, as a matter of course, not limited to them. Various deformations and modifications are possible within the scope of the invention. For example, the cooling device of the present invention may be applied to optical components-for use with ultraviolet rays, other than the EUV light, such as those having a wavelength not greater than 200 nm as ArF excimer laser or F2 laser, for example. Also, it can be applied to a mask or a wafer.

While the invention has been described with reference to the structures disclosed herein, it is not confined to the details set forth and this application is intended to cover such modifications or changes as may come within the purposes of the improvements or the scope of the following claims.

What is claimed is:

1. A projection optical system for projecting a pattern of a mask placed on an object plane, onto a substrate placed on an image plane, said projection optical system comprising, in an order along a light path from an object plane to the image plane:

a first reflection surface;
a second reflection surface;
a third reflection surface of convex shape;
a fourth reflection surface;
a fifth reflection surface; and
a sixth reflection surface,
wherein said projection optical system is arranged so that an intermediate image of the pattern formed on the mask is formed on the light path from said third reflection surface to said fourth reflection surface.

2. A projection optical system according to claim 1, wherein said first to sixth reflection surfaces are disposed substantially along a common optical axis, and wherein a principal ray reflected by said third reflection surface is reflected in a direction away from the optical axis while the principal ray reflected by said third reflection surface defines an angle, with respect to the optical axis, which angle is not less than 12 degrees and not greater than 70 degrees.

3. A projection optical system according to claim 1, wherein the spatial position of said third reflection surface is closer to the object plane than to said sixth reflection surface.

4. A projection optical system according to claim 1, wherein said fifth reflection surface has a convex shape and said sixth reflection surface has a concave shape.

5. A projection optical system according to claim 1, wherein said third reflection surface is an aspherical surface having an aspherical amount not less than 0.01 μm and not greater than 8 μm.

6. A projection optical system according to claim 1, wherein the spatial positions of the six reflection surfaces are placed in an order, from one closest to the object plane, of said second reflection surface, said fourth reflection surface, said first reflection surface, said third reflection surface, said sixth reflection surface, and said fifth reflection surface.

7. A projection optical system according to claim 1, wherein a largest value and a smallest value of incidence angle of light, incident on said fifth reflection surface, have a difference of not less than 8 degrees and not greater than 15 degrees.

8. A projection optical system for projecting a pattern of a mask placed on an object plane, onto a substrate placed on an image plane, said projection optical system comprising, in an order along a light path from an object plane to the image plane:
- a first reflection surface;
- a second reflection surface;
- a third reflection surface;
- a fourth reflection surface;
- a fifth reflection surface; and
- a sixth reflection surface;
- wherein said projection optical system is arranged so that an intermediate image of the pattern formed on the mask is formed on the light path from said third reflection surface to said fourth reflection surface;
- wherein said first to sixth reflection surfaces are disposed substantially along a common optical axis, and
- wherein a principal ray reflected by said third reflection surface is reflected in a direction away from the optical axis while the principal ray reflected by said third reflection surface defines an angle, with respect to the optical axis, which angle is not less than 12 degrees and not greater than 70 degrees.

9. A projection optical system for projecting a pattern of a mask placed on an object plane, onto a substrate placed on an image plane, said projection optical system comprising, in an order along a light path from an object plane to the image plane:
- a first reflection surface;
- a second reflection surface;
- a third reflection surface;
- a fourth reflection surface;
- a fifth reflection surface; and
- a sixth reflection surface;
- wherein said projection optical system is arranged so that an intermediate image of the pattern formed on the mask is formed on the light path from said third reflection surface to said fourth reflection surface,
- wherein the spatial position of said third reflection surface is closer to the object plane as compared with the spatial position of said sixth reflection surface.

10. An exposure apparatus, comprising:
- an illumination optical system for illuminating a mask having a pattern formed thereon;
- a projection optical system as recited in claim 1, for projecting the pattern of the mask as illuminated onto a substrate;
- a mask stage for holding the mask; and
- a substrate stage for holding the substrate.

11. A device manufacturing method, comprising the steps of:
- coating a substrate with a resist;
- exposing the resist-coated substrate to a pattern of a mask by use of an exposure apparatus as recited in claim 10; and
- developing the exposed substrate.

12. An exposure apparatus, comprising:
- an illumination optical system for illuminating a mask having a pattern formed thereon;
- a projection optical system as recited in claim 8, for projecting the pattern of the mask as illuminated onto a substrate;
- a mask stage for holding the mask; and
- a substrate stage for holding the substrate.

13. A device manufacturing method, comprising the steps of:
- coating a substrate with a resist;
- exposing the resist-coated substrate to a pattern of a mask by use of an exposure apparatus as recited in claim 12; and
- developing the exposed substrate.

14. An exposure apparatus, comprising:
- an illumination optical system for illuminating a mask having a pattern formed thereon;
- a projection optical system as recited in claim 9, for projecting the pattern of the mask as illuminated onto a substrate;
- a mask stage for holding the mask; and
- a substrate stage for holding the substrate.

15. A device manufacturing method, comprising the steps of:
- coating a substrate with a resist;
- exposing the resist-coated substrate to a pattern of a mask by use of an exposure apparatus as recited in claim 14; and
- developing the exposed substrate.

16. A projection optical system according to claim 1, wherein said projection optical system is arranged to project the pattern onto the substrate in a reduced scale.

17. A projection optical system according to claim 8, wherein said projection optical system is arranged to project the pattern onto the substrate in a reduced scale.

18. A projection optical system according to claim 9, wherein said projection optical system is arranged to project the pattern onto the substrate in a reduced scale.

* * * * *

UNITED STATES PATENT AND TRADEMARK OFFICE
CERTIFICATE OF CORRECTION

PATENT NO. : 7,268,855 B2  
APPLICATION NO. : 10/827968  
DATED : September 11, 2007  
INVENTOR(S) : Sasaki et al.

It is certified that error appears in the above-identified patent and that said Letters Patent is hereby corrected as shown below:

On the Title Page, under Item "(75) Inventors:", change "Masayuki Susuki" to -- Masayuki Suzuki --

Signed and Sealed this

Sixth Day of May, 2008

JON W. DUDAS  
*Director of the United States Patent and Trademark Office*